SELF-STARTING LSA MODE OSCILLATOR CIRCUIT ARRANGEMENT

Filed Jan. 30, 1967 2 Sheets-Sheet 1

INVENTOR
J. A. COPELAND III
BY Roderick B. Anderson
ATTORNEY

United States Patent Office 3,414,841
Patented Dec. 3, 1968

3,414,841
SELF-STARTING LSA MODE OSCILLATOR CIRCUIT ARRANGEMENT

John A. Copeland III, North Plainfield, N.J., assignor to Bell Telephone Laboratories, Incorporated, Murray Hill, Berkeley Heights, N.J., a corporation of New York Filed Jan. 30, 1967, Ser. No. 612,598
7 Claims. (Cl. 331—107)

ABSTRACT OF THE DISCLOSURE

A load is connected to an LSA mode oscillator circuit by a transmission line a plurality of wavelengths long. When oscillations are initiated, the circuit is loaded by the characteristic impedance of the transmission line which is chosen to be sufficiently high for self-starting, but after several cycles it is loaded by the transformed resistance of the load, which is chosen to be lower than the transmission line characteristic impedance for more efficient sustained operation.

*Background of the invention*

The structure and operation of two-valley devices, also known as bulk-effect devices, are described in detail in a series of papers in the Jan. 1966 issue of the IEEE Transactions on Electron Devices, vol. ED–13, No. 1. As is set forth in these papers, a negative resistance can be obtained from a bulk semiconductor wafer of substantially homogeneous constituency having two energy band minima within the conduction band which are separated by only a small energy difference. By establishing a suitably high electric field across opposite ohmic contacts of the semiconductive wafer, oscillations can be induced which result from the formation of discrete regions of high electric field intensity and corresponding space-charge accumulation, called domains, that travel from the negative to the positive contact at approximately the carrier drift velocity. A characteristic of the two-valley semiconductor material is that it presents a negative differential resistance to internal currents in regions of high electric field intensity. Hence, the electric field intensity of the domain grows as it travels toward the positive electrode.

Oscillators which operate according to this principle were first described in the paper "Instabilities of Current in III-V Semiconductors," by J. B. Gunn, IBM Journal, Apr., 1964, and are now generally known as Gunn oscillators. The domains are formed successively so that the oscillation frequency is approximately equal to the carrier drift velocity divided by the wafer length. Since the oscillation frequency is a function of length, Gunn oscillators are inherently frequency and power limited; as the sample length is reduced to give higher frequency, the attainable power decreases.

The copending patent application of J. A. Copeland III, Ser. No. 564,081, filed July 11, 1966, and the paper by J. A. Copeland III, "A New Mode of Operation for Bulk Negative Resistance Oscillators" Proceedings of the IEEE, Oct. 1966, pp. 1479–1480, describe how a new mode of oscillation, called the LSA mode (for Limited Space-charge Accumulation), can be induced in two-valley devices. This new mode of oscillation is not dependent on the formation of traveling domains, its frequency is not dependent on wafer length, and as a result, the oscillator does not have the frequency and power limitations of the Gunn oscillator. The LSA mode oscillator includes a two-valley semiconductor diode, a resonant circuit, and a load, the various parameters of which are adjusted such that the electric field intensity within the diode alternates between the high value at which negative resistance occurs, and a lower value at which the diode displays a positive resistance. By appropriately adjusting the duration of electric field excursions into the positive and negative regions of the diode, one can prevent the formation of the traveling domains responsible for Gunn-mode oscillation, while still obtaining the net negative resistance required for sustained oscillations.

The application points out that a fairly high load resistance is required to ensure that the voltage oscillations within the diode have a sufficiently high amplitude to extend into the positive resistance region of the diode. It has further been determined that if the oscillator circuit is to be self-starting, the load resistance which is required is even higher because it takes a certain period of time for the oscillations within the diode to build up the required amplitude. Unless there is a relatively high load resistance, so that the diode is "lightly loaded," space-charge accumulation and traveling domains may form before the LSA mode of operation has been established.

The high load resistance required for starting an LSA mode oscillator is usually substantially higher than the optimum load resistance for most efficient sustained operation. One way of circumventing this problem is to couple high frequency energy from an external source to the oscillator for the purpose of initiating the LSA mode. Once the mode has been established it will oscillate with the optimum load resistance, and the external source can be removed. This, of course, complicates the oscillator structure and makes it more expensive.

*Summary of invention*

Accordingly, it is an object of this invention to increase the efficiency of self-starting LSA mode oscillators.

It is another object of this invention to provide an LSA mode oscillator which is capable of operating with an appropriate load resistance for enhanced efficiency without resort to an external high frequency source for initiating the oscillations.

These and other objects of the invention are attained in an illustrative embodiment thereof comprising a two-valley semiconductor connected to a D-C voltage source and a resonant circuit, the parameters of which are adjusted to give LSA mode oscillation in accordance with the principles of the Copeland patent application. A load is connected to the resonant circuit by way of a transmission line a plurality of wavelengths long that is mismatched to the load.

When oscillations are first initiated by applying a D-C voltage across the diode, the diode "sees" as the load resistance the characteristic impedance of the transmission line, which is chosen to be sufficiently high for the establishment of the LSA mode. After several cycles of operation, the resistance of the load is reflected or transformed by the transmission line so that the diode then sees a transformed load resistance which is chosen to be of a lower value for more efficient operation. By the time that the transformed load resistance replaces the transmission line characteristic impedance as the effective load resistance seen by the diode, the LSA mode has become established; thereafter, the oscillator operates with an effective load resistance which is lower than the initial effective load resistance and which is more appropriate for efficient operation.

The transmission line is an example of a device for applying an initial load resistance which is high enough for initiating the LSA mode of oscillation, and subsequently automatically reducing the effective load resistance to a more optimum value for sustained operation. As will be explained later, the transmission line also provides more flexibility in the choice of the load resistances that can be used because, by choosing different lengths of transmission line, different load resistances can be transformed to give an optimum effective load resistance. Other devices can, however, be used for initially loading the oscillator with a high resistance and delaying for several cycles the application of a lower value of load resistance.

*Drawing description*

These and other objects, features, and advantages of the invention will be better understood from a consideration of the following detailed description, taken in conjunction with the accompanying drawing in which.

*Detailed description*

Figure 1:
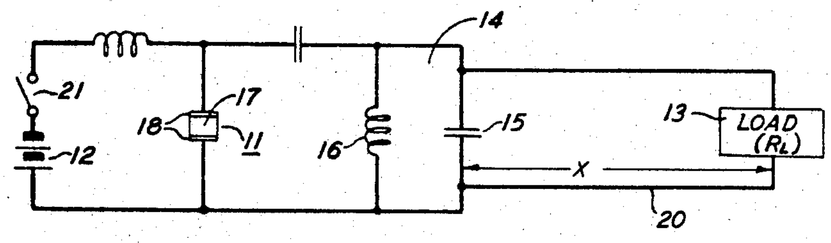
FIG. 1 is a schematic diagram of an illustrative embodiment of the invention.
Figure 2:
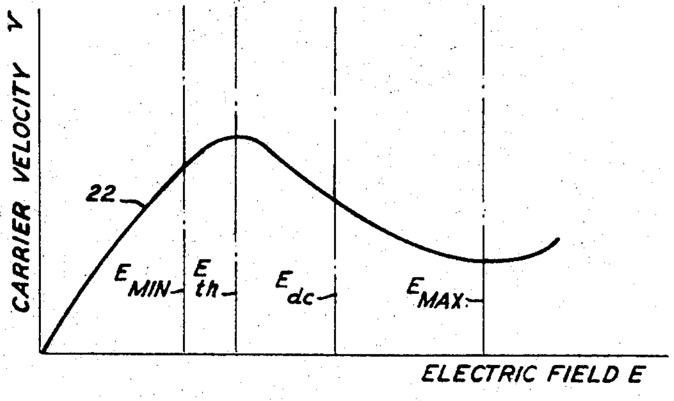
FIG. 2 is a graph of electron velocity $v$ versus electric field E in the diode of the circuit of FIG. 1.

Referring now to FIG. 1, there is shown an oscillator circuit arrangement in accordance with an illustrative embodiment of the invention comprising a two-valley semiconductor diode 11, a DC voltage source 12, a load 13, and a resonant tank circuit 14 having a capacitance 15 and an inductance 16 in parallel with the load. The diode 11 comprises a wafer 17 of two-valley semiconductor material included between substantially ohmic contacts 18. The wafer may be of n-type gallium arsenide of substantially uniform constituency which is doped in the manner known in the art to give a negative resistance characteristic 22 as shown in FIG. 2. For purposes of this application, a two-valley device shall mean any semiconductor device having a carrier velocity versus electric field characteristic of the general type shown in FIG. 2. For n-type materials the carrier velocity refers to electron velocity and for p-type materials it refers to hole velocity.

Figure 2A:
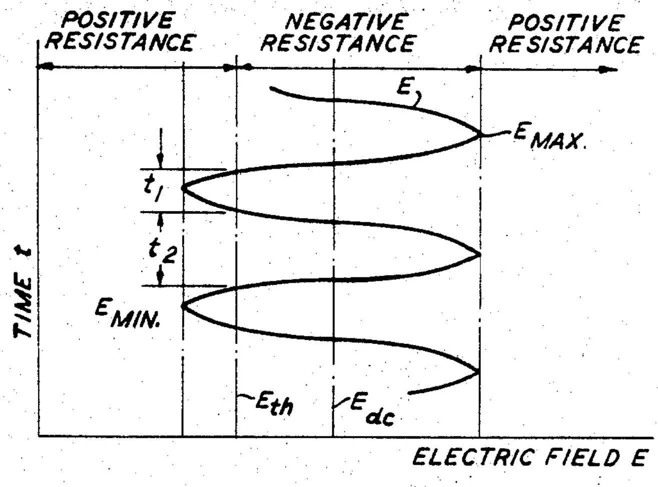
FIG.2A is a graph of time $t$ versus electric field E in the diode of the circuit of FIG. 1.

The purpose of the circuit is to generate oscillations in the oscillatory mode described in the aforementioned Copeland application and Copeland publication, which is now generally known as the Limited Space-charge Accumulation mode or LSA mode. As shown in FIG. 2, the DC bias voltage across the diode $E_{dc}$ is higher than the threshold voltage $E_{th}$ at which negative resistance within the diode occurs. However, when the circuit begins to oscillate, the electric field intensity E within the diode alternates about the bias voltage $E_{dc}$ as shown in FIG. 2A. During the time interval $t_1$ of each cycle, the voltage in the diode extends below the threshold voltage $E_{th}$ into the positive resistance region of the diode, while during the remaining portion of the cycle $t_2$ it extends into the negative resistance region above $E_{th}$. The frequency at which the alternations occur is determined by the tank circuit 14, while the amplitude is a function of the load resistance of the circuit.

In spite of the fact that electric field E extends into the positive resistance region, the gain of the device will exceed its attenuation if the following relation relationship is satisfied, $$\frac{1}{t_1+t_2}\int^{(t_1+t_2)} Evdt < E_{dc}v_a \qquad (1)$$

where the integral is taken over one cycle, E is the electric field, $v$ is the carrier velocity, $t$ is time, and $v_a$ is the average carrier drift velocity in the sample during oscillation. As pointed out in the Copeland application, frequency and power limiting traveling domains are prevented by making the time interval $t_2$ small enough so that a substantial space-charge accumulation cannot occur during that time interval, and $t_1$ long enough to attenuate space-charge accumulation to prevent it from growing with succeeding cycles. To meet these requirements the following relations should be satisfied, $$\frac{ne}{\epsilon}\int^{(t_2)} |\mu| dt < 10 \qquad (2)$$

$$\frac{ne}{\epsilon}\int^{(t_1)} \mu dt > \frac{ne}{\epsilon}\int^{(t_2)} |\mu| dt \qquad (3)$$

where $\int^{(t_2)}$ is the integral taken over time period $t_2$, $\epsilon$ is the permittivity of the sample, $\mu$ is the differential mobility of the sample $$\frac{dv}{dE}$$

$e$ is the charge on a majority carrier and $\int^{(t_1)}$ is the integral taken over time period $t_1$.

In order to give the oscillating field E sufficient amplitude to extend into the positive resistance region and to rise sharply into the negative resistance region, the circuit should be "lightly loaded"; i.e., the effective parallel load resistance should be fairly high. For a gallium arsenide diode, it is recommended in the Copeland application that the load resistance conform to the relationship, $$R > \frac{l}{n_0|\mu_2|eA} \qquad (4)$$

where $l$ is the length of the sample, $n_0$ is a doping level or average carrier concentration, A is the area of the sample in a plane parallel to the contacts, $|\mu_2|$ is the average mobility in the negative resistance region, which is given by, $$|\mu_2| = \frac{1}{t_2}\int^{(t_2)} |\mu| dt \qquad (5)$$

It can be shown that the efficiency $\eta$ of an LSA mode oscillator circuit is given by the relation, $$\eta = 1 - \left[\int^{(t_1+t_2)} Evdt/(t_1+t_2)E_{dc}v_a\right] \qquad (6)$$

The oscillator circuit load resistance R is related to oscillator efficiency by the equation, $$R = R_0\mu_1(E_{max}-E_{min})^2/8\eta E_{dc}v_a \qquad (7)$$

where $E_{max,min}$ are the positive and negative maximum field excursions in the wafer as depicted in FIG. 2A, and $R_0$ is the internal resistance of the diode in the positive resistance region which is given by, $$R_0 = \frac{l}{n_0\mu_1 eA} \qquad (8)$$

where $\mu_1$ is the mobility in the positive resistance region. The optimum load resistance for high efficiency may be found by determining the values of $E_{max}$ and $E_{min}$ for giving maximum efficiency $\eta$ and using this value in Equation 7. In most cases, the optimum load resistance for high efficiency is lower than the minimum load resistance required for LSA mode self-starting.

The alternating field E of FIG. 2A is initiated by closing the switch 21 of FIG. 1 which creates transient AC fields in the resonant circuit 14. Unless the effective load resistance of the oscillator is much higher than the internal resistance of the diode, much of the transient AC energy of the tank circuit will be directed into the load as well as into the diode 11. As a result, the amplitude of the alternating electric field $(E_{max}-E_{min})/2$ in the diode may not be sufficiently high to extend the field E into the positive resistance region as is required for establishment of the LSA mode.

It can be shown that a self-starting LSA mode oscillator requires an initial load resistance which is equal to or greater than about 60 times the low-field resistance of the diode or, $$R \gtrsim 60R_0 \qquad (9)$$

$R_0$ is defined by Equation 8.

If relationships (7) and (9) are consistent, then an LSA mode oscillator circuit will be self-starting with a load resistance that is appropriate for optimum efficiency. In most situations, however, these conditions are inconsistent, and an LSA oscillator circuit requires a higher load resistance for self-starting than that which gives optimum efficiency.

As mentioned before, another solution is to use an external high frequency source for initiating the oscillations. A burst of AC energy at the resonant frequency of resonator 14 may be coupled to the diode to create the field E of FIG. 2A for several cycles, and thereafter the circuit will continue to oscillate at the resonant frequency even though the load resistance given by relationship (5) is too small to make the circuit self-starting. This, of course, considerably complicates the circuit structure.

In accordance with the invention, the load 13 is connected to the oscillator circuit by a mismatched transmission line 20 which is a plurality of wavelengths long at the operating frequency. Because of the length of the transmission line, the oscillator circuit is not initially loaded by the load 13, but rather, is loaded by the characteristic impedance $Z_0$ of the transmission line 20 which is chosen to conform with the requirements of relationship (6) for appropriate self-starting, or, $$Z_0 \gtrsim 60 R_0 \qquad (10)$$

Hence, when switch 21 is closed, the oscillator circuit will initially be lightly loaded and sufficient transient energy from the resonator 14 will be directed through the diode 11 to give an electric field E that extends into the positive resistance region as illustrated in FIG. 2A.

After several cycles of operation, energy will have been transmitted from the resonator 14 to the load 13 and back again to the resonator, and the oscillator circuit will then be loaded by the load 13. However, because the transmission line 20 is a plurality of wavelengths long, it will act as an impedance transformer and the transformed load resistance $R_T$ seen by the oscillator circuit will be, $$R_T = Z_0 \frac{R_L + Z_0 \tan\left(2\pi \frac{x}{\lambda}\right)}{Z_0 + R_L \tan\left(2\pi \frac{x}{\lambda}\right)} \qquad (11)$$

where $R_L$ is the actual impedance of load 13, $Z_0$ is the characteristic impedance of transmission line 20, $x$ is the length of transmission line 20, and $\lambda$ is the wavelength at the operating frequency. It can be appreciated that the values of $R_L$ and $x$ can be chosen to optimize the effective oscillator circuit load resistance $R_T$ for maximum efficiency. If $R_T$ is made equal to the resistance given by Equation 7, the oscillator circuit will operate at maximum efficiency, even though the transformed load resistance may not be sufficiently high for self-starting.

The invention is, in effect, a device for applying an initial load resistance which is high enough for initiating the LSA mode of oscillation, and thereafter automatically reducing the effective load resistance to a more optimum value for sustained operation. It is within the ordinary skill of a worker in the art to choose the characteristic impedance of the transmission line 20 to comply with the resistance required by Equation 9 for initiating the oscillatory mode, and simultaneously choosing a transformed load resistance $R_T$ that is lower than the initial temporary load resistance (the transmission line resistance) for enhancing circuit efficiency. While Equation 7 gives the condition for maximum efficiency, it is not necessary that the transformed load resistance $R_T$ comply with that equation; in order to improve the efficiency in accordance with the invention it is necessary only that $R_T$ be lower than the transmission line characteristic impedance used for self-starting.

The length $x$ of the transmission line 20 should be sufficient to give the oscillator time to build up to the amplitude required for LSA mode operation before the circuit is loaded by resistance $R_T$. I have found empirically that for a gallium arsenide diode, self-starting requires the large initial load resistance for at least six cycles to establish the LSA mode. To give this required time delay, the transmission line should be at least three wavelengths long, and of course it may be longer.

Since the mismatched transmission line 20 acts as an impedance transformer, the user has a choice of the actual load resistance $R_L$ that he may use for load 13. For example, as can be seen from Equation 11, if the length $x$ is an integral number of half wavelengths plus a quarter wavelength long at the operating frequency, the $R_T$ will be inversely proportional to $R_L$. If on the other hand, the transmission line is an integral number of half wavelengths long, $R_T$ will be directly proportional to $R_L$. As a result, the actual value of $R_L$ may be either higher or lower than the characteristic resistance of the transmission line while still attaining an effective transformed load resistance that is lower than the transmission line characteristic impedance in accordance with the invention.

Figure 3:
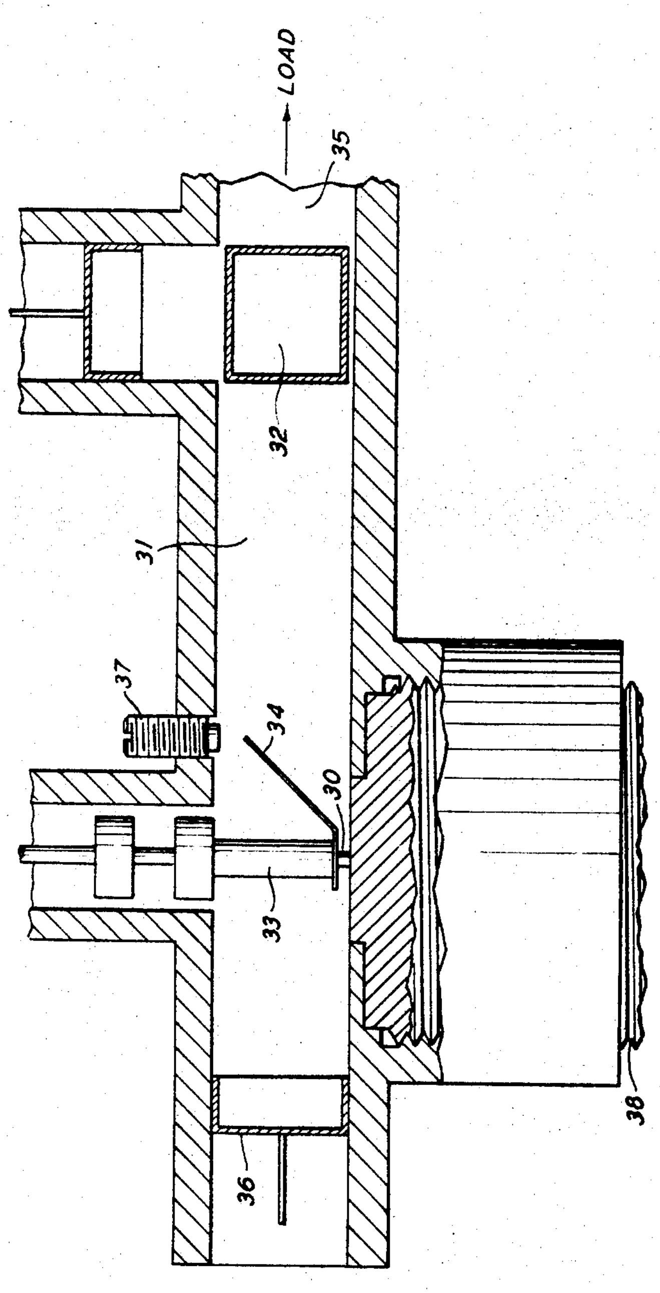
FIG. 3 is a schematic illustration of another embodiment of the invention.

FIG. 3 shows an actual circuit which has been constructed to demonstrate the principles of the invention. A two-valley semiconductor diode 30 is mounted within a rectangular waveguide 31 which is coupled to a load by way of an E–H tuner 32. The diode is appropriately biased by a voltage source connected to a conductor 33. The resonant circuit 14 of FIG. 1 is formed by the capacity of the diode and the inductance of a flat conductor 34 connected to the diode which extends toward a tuning screw 37. The purpose of the E–H tuner 32 is to create a mismatch between waveguide 31 and waveguide 35. Waveguide 35 is matched to the load so that the load is effectively connected to the circuit at the E–H tuner 32. A tuning plunger 36 also constitutes part of the loading circuit; the tuning plunger 36 and E–H tuner 32 are adjusted for maximum output consistent with self-starting.

When the diode is initially excited, oscillatory wave energy is reflected between the E–H tuner 32 and the plunger 36 for several cycles due to the mismatch with waveguide 35. During the time before the signal travels to the E–H tuner 32 or the plunger 36 and reflects back to the diode, the oscillator is loaded by the characteristic impedance of waveguide 31. As a standing wave between the plunger and the tuner builds up to equilibrium, the load (not shown) is increasingly coupled to the oscillator circuit. The apparatus of FIG. 3 differs from the circuit of FIG. 1 in that the time delay before permanent loading is equal to the time required to build up a stable standing wave between plunger 36 and E–H tuner 32, rather than the time required for the initial reflection of energy from the actual load.

In the apparatus of FIG. 3, RG–98 rectangular waveguides were used with the circuit tuned at 51 gigahertz. The plunger 36 and T–H tuner 32 each were about five wavelengths from the diode 30. The diode was thermal compression bonded to the top of a cylindrical mounting pellet 38 of OHFC copper which fitted flush into the bottom surface of the waveguide. The diode was pressure contacted from above the conductor 33 which also supported the inductive stub 34. Gallium arsenide diodes were used having a doping level of the active region of from $6 \times 10^{15}$ to $10^{16}$ cm.$^{-3}$ with thicknesses from 6 to 20 microns. 1 to 20 milliwatts of continuous output power at frequencies of from 44 to 51 gigahertz were obtained. The efficiencies were as high as 9 percent which compares favorably with the maximum theoretical efficiency for gallium arsenide two-valley diodes of 18.5 percent excluding circuit losses.

In summary, the invention is based on the discovery that a continuous LSA mode oscillator can both be self-starting and operate with high efficiency if a predetermined high load resistance is applied for more than six cycles of operation, with a lower value of resistance being subsequently applied. Two embodiments have been shown for accomplishing this function, and it is to be understood that various other devices could alternatively be used for providing the required delay.

Other modifications and various other embodiments may be made by those skilled in the art without departing from the spirit and scope of the invention.

What is claimed is:

1. An oscillator circuit arrangement comprising, a two-valley semiconductor device connected to a resonant circuit having a characteristic resonant frequency, a load having a resistance, means for producing within the device an electric field that oscillates at the resonant frequency between positive and negative differential resistance regions, the time interval of each cycle of oscillation at which the electric field is in the negative resistance region being sufficiently large to give a net gain over the entire cycle, the time interval at which the electric field is in the positive resistance region being sufficiently large to preclude the formation of traveling domains, whereby the circuit operates in the LSA oscillatory mode, wherein the improvement comprises:

means for interconnecting the semiconductor device and the load;

the interconnecting means having a time delay equal to a plurality of periods of oscillation at the resonant frequency, thereby transforming the resistance of the load seen by the semiconductor device;

the interconnecting means having a characteristic impedance that is higher than the transformed resistance of the load as seen by the semiconductor device, whereby, when oscillations are initiated in the semiconductor device the oscillator circuit is loaded by the transmission line characteristic impedance, but after a plurality of cycles of oscillation, the oscillator circuit is loaded by the transformed resistance of the load.

2. The oscillator circuit arrangement of claim 1 wherein:

the characteristic impedance of the interconnecting means is more than thirty times the internal positive resistance of the semiconductive device.

3. The oscillator circuit arrangement of claim 1 wherein:

the transformed load resistance $R_T$ conforms approximately to the relation, $$R_T \approx \frac{l}{n_o|\mu_2|eA}$$

where $l$ is the length of the semiconductor wafer between the opposite contacts, $n_0$ is the average carrier concentration in the sample, $\mu_2$ is the average mobility of the sample in the negative resistance region, $e$ is the charge on a majority carrier in the sample, and A is the area of the sample in the plane parallel to the opposite contacts, whereby the circuit operates with high efficiency when loaded by the transformed load resistance.

4. The oscillator circuit arrangement of claim 1 wherein:

the interconnecting means is a transmission line of at least three wavelengths long at the frequency of the resonant circuit, whereby the device oscillates for at least six cycles before being loaded by the transformed load resistance.

5. The oscillator circuit arrangement of claim 1 wherein:

the interconnecting means is a transmission line an integral number of half wavelengths long at the resonant frequency;

and the actual resistance of the load is smaller than the transmission line characteristic impedance.

6. The oscillator circuit of claim 1 wherein:

the interconnecting means is a transmission line having a length equal to an integral number of half wavelengths plus a quarter wavelength at the operating frequency;

and the actual resistance of the load is greater than the characteristic impedance of the transmission line.

7. The oscillator circuit of claim 1 wherein:

the interconnecting means is a part of a resonant circuit.

No references cited.

JOHN KOMINSKI, *Primary Examiner.*